US008620638B1

(12) United States Patent
Chan et al.

(10) Patent No.: US 8,620,638 B1
(45) Date of Patent: Dec. 31, 2013

(54) METHOD OF PERFORMING A SIMULATION OF A DESIGN UNDER TEST AND A CIRCUIT FOR ENABLING TESTING OF A CIRCUIT DESIGN

(75) Inventors: Chi Bun Chan, San Jose, CA (US); Jingzhao Ou, Sunnyvale, CA (US); Shay Ping Seng, San Jose, CA (US); Nabeel Shirazi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 597 days.

(21) Appl. No.: 12/335,025

(22) Filed: Dec. 15, 2008

(51) Int. Cl.
*G06F 17/50* (2006.01)
*G06G 7/62* (2006.01)

(52) U.S. Cl.
USPC .............................. 703/14; 703/13

(58) Field of Classification Search
USPC .................. 703/13, 14, 15; 326/39; 716/108; 370/419
See application file for complete search history.

(56) References Cited

U.S. PATENT DOCUMENTS

| | | | | |
|---|---|---|---|---|
| 5,919,270 | A * | 7/1999 | Arkin | 714/736 |
| 6,370,675 | B1 * | 4/2002 | Matsumura et al. | 716/108 |
| 6,789,220 | B1 * | 9/2004 | Lovejoy | 714/733 |
| 6,961,883 | B2 * | 11/2005 | Tsuji | 714/721 |
| 7,188,041 | B1 * | 3/2007 | Secatch | 702/108 |
| 7,376,544 | B1 * | 5/2008 | Dick et al. | 703/14 |
| 7,478,030 | B1 * | 1/2009 | Ballagh et al. | 703/19 |
| 7,590,137 | B1 * | 9/2009 | Chan et al. | 370/419 |
| 2007/0061644 | A1 * | 3/2007 | Birmiwal et al. | 714/726 |

OTHER PUBLICATIONS

Ichihara, Hideyuki et al., "Channel Width Test Data Compression under a Limited Number of Test Inputs and Outputs", 2003, 16th International Conference on VLSI Design (VLSI '03), IEEE Computer Society.*
Amiri, Amir M. et al., "On the Timing Uncertainty in Delay-Line-Based Time Measurement Applications Targeting FPGAs", 2007, IEEE.*
IO Tech, "Signal Conditioning & PC-Based Data Acquisition Handbook", Jan. 10, 2005.*

* cited by examiner

*Primary Examiner* — David Silver
*Assistant Examiner* — Cedric D Johnson
(74) *Attorney, Agent, or Firm* — John J. King

(57) ABSTRACT

A method of performing a simulation of a design under test is disclosed. The method comprises implementing an input block having an adjustable output width; coupling test data to the input block; generating an input signal comprising the test data for the design under test according to an input requirement for the design under test by way of the input block; implementing an output block having an adjustable input width for receiving data from an output of the design under test; and coupling the output of the design under test to the output block according to an output requirement of the design under test. A circuit for enabling testing of a circuit design implemented in an integrated circuit is also disclosed.

19 Claims, 7 Drawing Sheets

METHOD OF PERFORMING A SIMULATION OF A DESIGN UNDER TEST AND A CIRCUIT FOR ENABLING TESTING OF A CIRCUIT DESIGN

FIELD OF THE INVENTION

The present invention relates generally to integrated circuits, and in particular, to a method of performing a simulation of a design under test.

BACKGROUND OF THE INVENTION

A high-level modeling system (HLMS) provides a high-level abstraction of low-level hardware components and intellectual property (IP) cores for an integrated circuit. These systems allow electronic designs to be described and simulated in a high-level modeling environment, which are then automatically translated into corresponding low-level hardware implementations. Unlike traditional hardware description language (HDL) based design approaches, users instantiate high-level modeling blocks and wire them up properly to construct the target system in a HLMS. Many HLMS design tools provide mechanisms such as automatic rate-and-type propagation, high-level resource estimation and timing analysis tools to facilitate the modeling process. One important advantage of a HLMS is that it offers a rich set of simulation and verification techniques integrated with the high-level abstraction.

According to conventional modeling systems, various blocks define the interfaces of an electronic design being modeled. For example, a "gateway in" block is translated into an input port of the design, while a "gateway out" block is translated into an output port. The "gateway in" block also specifies the data type conversion method and sampling frequency of the associated input signal. "Gateway in" blocks of conventional modeling systems only accept and produce scalar samples. This limitation forces the user to serialize multi-dimensional samples into scalar samples before feeding the samples into the "gateway in" block.

When a design under test (DUT) is compiled for hardware co-simulation, a hardware co-simulation block with the same interface is generated. On every simulation cycle, the hardware co-simulation block forwards a scalar sample to the corresponding input port of the DUT running in hardware. Each output port of the DUT produces a scalar sample, which is sent back to the hardware co-simulation block. This communication between the host and the hardware incurs significant overhead due to packetization, routing, synchronization, protocol, etc. Accordingly, conventional systems for simulating designs have significant limitations.

SUMMARY OF THE INVENTION

A method of performing a simulation of a design under test is disclosed. The method comprises implementing an input block having an adjustable output width; coupling test data to the input block; generating an input signal comprising the test data for the design under test according to an input requirement for the design under test by way of the input block; implementing an output block having an adjustable input width for receiving data from an output of the design under test; and coupling the output of the design under test to the output block according to an output requirement of the design under test.

According to an alternate embodiment, a method of performing a simulation of a design under test comprises generating the design under test in logic of an integrated circuit, wherein an input block having an adjustable output width implemented in logic of the integrated circuit is coupled to an input of the design under test and an output block having the adjustable input width implemented in logic of the integrated circuit is coupled to an output of the design under test; coupling test data to the input block using a simulation engine; generating an input signal comprising test data for the design under test according to an input requirement for the design under test by way of the input block; and coupling the output of the design under test to the output block according to an output requirement of the design under test.

A circuit for enabling testing of a circuit design implemented in an integrated circuit is also disclosed. The circuit comprises a design under test implemented in the integrated circuit, the design under test having an input port comprising a first data width for receiving test data and an output port comprising a second data width for outputting data; an input block coupled to the design under test, the input block having an input for receiving test data and having an adjustable output width for coupling the test data having the first data width to the input port of the design under test; an output block coupled to the design under test, the output block having the adjustable input width for receiving output data from the output port of the design under test at an input port comprising second data width.

DETAILED DESCRIPTION

Figure 1:
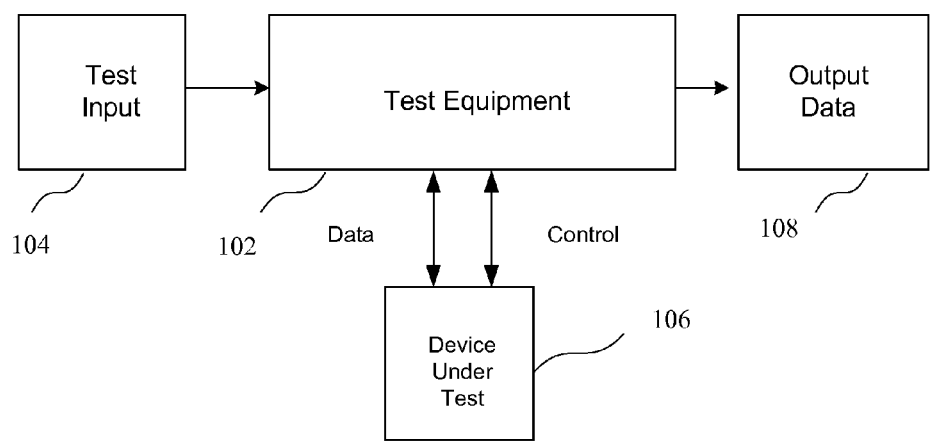
FIG. 1 is a block diagram of a circuit for testing a design under test in an integrated circuit according to an embodiment the present invention.

Turning first to FIG. 1, a block diagram of a circuit for testing a design under test in an integrated circuit according to an embodiment the present invention is shown. In particular, test equipment 102 receives a test input 104 comprising test data and/or configuration data for a device under test 106 and generates output data 108. The test equipment 102 couples data and control signal to and receives return data and control signals from the device under test 106. The return data may comprise a test output from the device under test provided to the test equipment. The test output will generally provide information verifying circuit elements in the device under test. As will be described in more detail below, the embodiments of the present invention provide information related to an integrated circuit, such as a programmable logic device.

As part of the development process of a DUT which may be implemented in the device under test 106, a test bench is often created to mimic the execution of the DUT in real situations. The test bench drives the DUT with certain input stimuli and compares the output results produced by the DUT with some reference data. While the DUT may be designed in a way that the data going into and coming out from the DUT are serialized into a stream of scalar values or several parallel streams of scalar values where the DUT has multiple channels, input stimuli in many digital signal processing applications are in the form of multi-dimensional data. Examples of multi-dimensional input stimuli include continuous streams of sound waves, two dimensional images, and streaming videos composed of multiple frames. Accordingly, marshalling the input stimuli to a desired format is required.

However, such data marshalling is tedious and error-prone. When evaluating a DUT using hardware co-simulation where the communication between the test equipment and the hardware is a bottleneck, the data marshalling needs to be efficient and optimized for the underlying communication interfaces to improve the simulation. It is important for an HLMS to provide a transparent and efficient mechanism to exchange simulation data and results between the test bench and the DUT. To address these modeling and simulation requirements, the circuits and methods set forth below provide adaptive gateway interfaces for high-level modeling and simulation, and provides a simple but flexible user interface to integrate a DUT operating on scalar values into a test bench operating on multi-dimensional data. The circuits and methods also increases the speed of simulations without sacrificing design abstraction, and provide a consistent transition between software simulation and hardware co-simulation.

Figure 2:
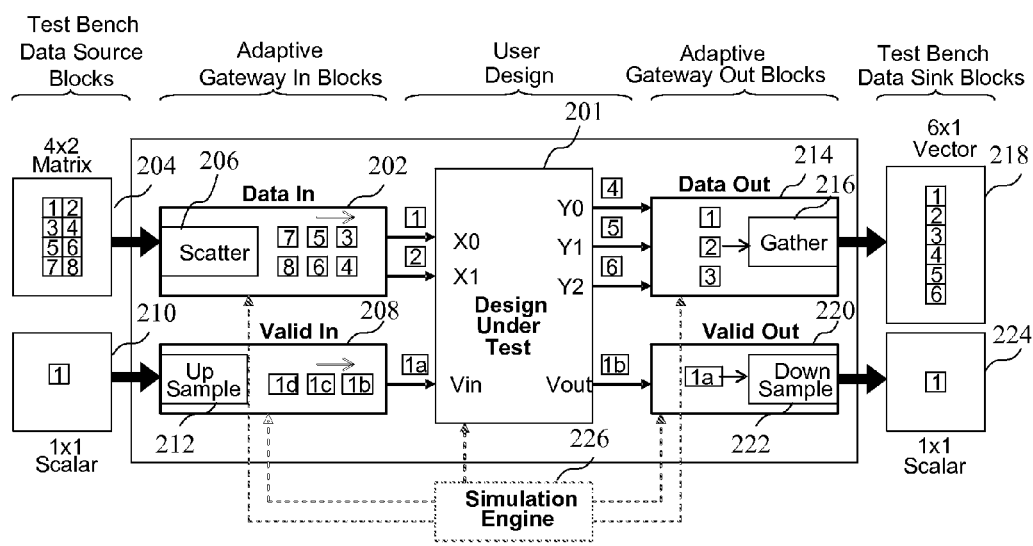
FIG. 2 is a block diagram of system for performing a simulation of a design under test which may be implemented in the block diagram of FIG. 1 according to an embodiment of the present invention.

Turning now to FIG. 2, a block diagram of system for performing a simulation of a design under test according to an embodiment of the present invention is shown. A DUT 201 is coupled to receive input data at inputs X0 and X1 from a data input block 202 comprising an adaptive gateway input block. The data input block 202 receives data from a test bench data source block 204 and comprises a scatter block 206. As will be described in more detail below, the scatter block transforms the data by formatting the data from the test bench data source block 204 to conform to an input requirement of the DUT 201. While a 2-input interface is shown according to the embodiment of FIG. 2, other designs under test may have a different number of inputs and the data input block may be configured with a number of output according to the input requirement of the design under test. A valid data input block 208 comprising a second adaptive gateway input block is coupled to receive a data valid signal from another test bench data source block 210. An up sampling circuit 212 converts the data to values coupled to the valid input (Vin) of the DUT 201, as will be described by way of example below.

Similarly, a data output block 214 comprising an adaptive gateway output block is coupled to receive output data from the design under test, shown here as a 3-output interface at the outputs Y0-Y2. While a 3-bit output is shown, other designs under test may have a different number of outputs and the data output block may be configured with a number of inputs according to the output requirement of the design under test. A gather block 216 receives the data from the design under test and converts it to a format for the test bench data sink block 218. A valid output block 220 is coupled to receive the valid output signal from a Vout output of the design under test. A down sampling circuit 222 generates the output signal for the test bench data sink block 224. Finally, a simulation engine 226 controls the adaptive gateway input blocks and the adaptive gateway output blocks to generate the appropriate inputs to the design under test, and receive outputs generated according to an output requirement of the design under test. That is, the simulation engine will ensure that the gateway input and output blocks accommodate the device under test by configuring the appropriate outputs of the data input block corresponding to the input requirements of the design under test and the appropriate inputs of the data output block according to the output requirements of the design under test. The simulation engine may implement the various elements of FIG. 2 in software running on the test equipment, which may comprise a computer configured for testing integrated circuits.

The data input block 202 marshals the original samples collected from the test bench, and constructs the corresponding serialized samples as expected by the DUT interface. The data marshalling considers the dimension and sampling rate of samples. A sample may be of an arbitrary dimension such as a scalar (1×1), a vector (M×1 or 1×N), a matrix (M×N), or a value of a higher dimension. The sample rate specifies the number of simulation cycles to produce a sample. If the DUT consumes scalar samples, it is necessary to marshal a multi-dimensional sample into a sequence of scalar values before feeding them into the input ports of the DUT. The data input block automatically handles the data marshalling according to a number of predetermined steps. Before a simulation is performed, the simulation engine determines the dimension and sample rate of input samples from the test bench. A buffer of size P is created inside the data input block 202 for holding a multi-dimensional sample that contains P scalar values. In the software simulation, the buffer is scanned in a pre-defined or user-specified order and individual scalar values are extracted, and each scalar value is fed to the DUT.

In order to preserve the same bit and cycle accurate simulation semantics, the simulation scheduling of the DUT and the test bench are adjusted accordingly with respect to the dimension and sample rate of input samples. The DUT is scheduled at an appropriate rate with respect to the test bench, such that it has enough cycles to consume the entire input sample before a new sample is supplied by the test bench. As shown by way of example in FIG. 2, the DUT processes an input frame of dimension 4×2 and produces an output vector of dimension 6×1. There is also an input valid signal comprising a scalar and an output valid signal comprising a scalar to indicate the validity of frames.

In particular, during the software simulation according to the embodiment of FIG. 2, two scalar values are consumed at a time, and fed into port X0 and X1, respectively, since the DUT interface comprises two input data ports. The valid input block 208 receives input valid data associated with the input frame. As the input frame from the test bench is serialized into a sequence of scalar pairs, the up sampling circuit 212 samples the valid value to produce four valid values designated as 1a-1d that are fed into the Vin port of the DUT, one for each of the scalar pairs. The DUT produces three scalar values at the outputs Y0-Y2 at a time along with a valid value at the Vout of the DUT. The data out block 214 aggregates the scalar values into a 6×1 vector to form an output frame. The valid out block 220 down samples the valid values output from the Vout port, so that only one value indicating whether the data is valid is produced per output frame.

Figure 3:
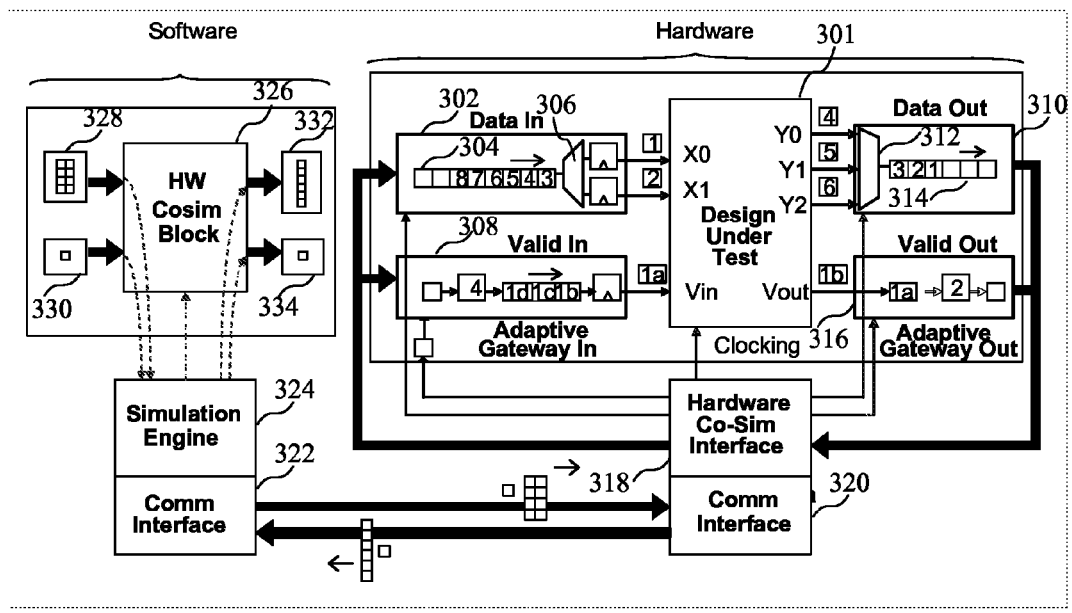
FIG. 3 is a block diagram of system for performing a simulation of a design under test which may be implemented in the block diagram of FIG. 1 according to an alternate embodiment of the present invention.

Turning now to FIG. 3, a block diagram of system for performing a simulation of a design under test according to an alternate embodiment of the present invention is shown. According to the embodiment of FIG. 3, hardware co-simulation is performed. A hardware portion of the system of FIG.

3 comprises the DUT 301 which may be implemented in programmable logic of a device, for example. The DUT 301 may be coupled to a data input block 302 comprising an adaptive gateway input block having a data storage element 304. Data from the data storage element is coupled to a de-multiplexer 306 for coupling data to a selected input of a predetermined number of inputs of the design under test. A valid input block 308 also comprises data which is coupled to the valid input of the design under test. As will be described in more detail below, the valid input block up samples the valid data signal by holding a sample of the valid data signal for certain number of cycles before consuming the next sample. A data output block 310 comprising an adaptive gateway output block has a multiplexer 312 which receives data from one of a plurality of outputs of the design under test. In particular, the multiplexer 312 selects one of the outputs and couples the output to a data storage element 314 of the data output block 310. A valid output block 316 also receives a valid output signal from the design under test.

A number of elements are also provided according to the embodiment of FIG. 3 to interface with the hardware and which may be provided in either software or hardware. A hardware co-simulation interface 318 is coupled to provide data to the adaptive gateway input blocks and receive data from the adaptive gateway output blocks. The hardware co-simulation interface also controls the adaptive gateway input blocks and adaptive gateway output blocks to ensure that they are configured with the appropriate outputs and inputs corresponding to the inputs requirements and output requirements of the design under test. The hardware co-simulation interface is coupled to a communication interface 320 associated with the hardware and a communication interface 322 associated with a simulation engine 324. As shown in FIG. 3, the simulation engine comprises a hardware co-simulation block 326 adapted to generate the test bench data source 328 which may comprise a 4×2 matrix coupled to the hardware and the data valid signal 330 comprising a scalar, and receive the data output 332 and the valid data output 334 from the hardware.

In hardware co-simulation as will be described in more detail in reference to FIG. 3, the entire buffer is sent to the hardware, preferably in a single transfer, each time a new input sample is supplied from the test bench. There is a corresponding buffer of size P in the hardware to hold an input sample. Additional logic is implemented in hardware to scan the buffer in the required order and extract individual scalar values. Each scalar value is fed to the DUT that is emulated in hardware. The data output block 210 operates in the same manner as the data input block 302, but reverses the data marshalling process. It gathers scalar samples produced by the DUT and turns them into multi-dimensional samples of a given dimension such as a 6×1 vector.

During the hardware co-simulation, the hardware co-simulation block 326 forwards the stimuli generated by the test bench to the hardware. An input frame as a 4×2 matrix and a valid value are sent collectively in a single transfer over the communication interfaces. The hardware co-simulation block pushes the received input frame from the test bench into data input block 302. The data input block stores the input frame in a buffer, from where two scalar values are taken at a time and multiplexed into two registers. That is, the data input block essentially implements a buffer with a time division de-multiplexer (TDD). Similar to the software simulation described above in reference to FIG. 2, the input valid value is up sampled to produce four valid values associated with the scalar pairs. Because four scalar pairs are generated from the eight scalar values, four data valid signals must be provided to the design under test. Accordingly, the valid input block holds the current sample of the valid input signal in order to generate four signals, designated $1a$-$1d$, associated with the four pairs of input data bits coupled to X0 and X1. The hardware co-simulation interface clocks the DUT when the data are present to the DUT input interface. This is synonymous to the scheduling performed by the software simulation engine according to the sample rate and data transition process of gateway blocks set forth above with respect to FIG. 2.

The data out block 310 aggregates results from port Y0, Y1 and Y2 into an output frame. The data out block essentially implements a buffer with a time division multiplexer (TDM) implemented by the multiplexer 312. The valid output block also down-samples the outputs of the Vout port of the DUT 301, and produces one valid value per output frame. The output frame and the valid value are sent back to the hardware co-simulation block in a single transfer over the communication interfaces, where the hardware co-simulation block forwards the received outputs to the test bench.

According to one embodiment of the invention, by transferring more simulation data in a single burst rather than transferring scalar values, the overheads associated with each transfer become relatively lower and the bandwidth of the communication link is better utilized. It is thus preferable to bundle as many as possible data samples in a single transfer to improve the performance of hardware co-simulation. If the test bench is constructed to use multi-dimensional data (e.g. vectors or frames), it is advantageous to send the multi-dimensional data in each transfer.

Further, users may easily switch between different simulation and verification techniques depending on the specific development phases and simulation requirements. For example, the Xilinx System Generator for DSP (SysGen) available from Xilinx, Inc. from San Jose, Calif. provides hand-written MATLAB M-code based simulation models and/or automatically generated C simulation models for the basic hardware description blocks. For complicated IP cores and user HDL designs, SysGen integrates HDL simulators, such as ModelSim and ISE Simulator, for HDL co-simulation. Users may plug in their software simulation engines (e.g., transaction-level models) into SysGen to co-simulate the high-level models. In addition, SysGen provides hardware co-simulation, which allows users to emulate a portion of a high-level model on a hardware platform, typically a PLD, while the rest of the model is simulated using software models running on a host computer of the test equipment. The simulation on the hardware platform is controlled by a host computer of the test equipment, which coordinates data transfers between the software and hardware simulation engines. Hardware co-simulation is advantageous over software-based simulations for numerous reasons, including simulation acceleration, hardware debugging, and real-time verification. SysGen provides the automation from combining the DUT with appropriate co-simulation and communication interface, generating a hardware implementation of the composite, and coordinating the co-simulation between the software and hardware environment.

Accordingly, the circuits of FIGS. 2 and 3 also provide a higher level of abstraction over the data marshalling process between a DUT and a test bench. The abstraction allows a smooth transition from software simulation to hardware co-simulation and, at the same time, enables efficient data transfers between a host computer and the hardware. Specially, the adaptive gateway interface provides a consistent abstract interface for marshaling data between a DUT and a test bench under various simulation conditions. Because both software simulation and hardware co-simulation have the same simulation scheduling mechanism, users may expect to have the same simulation results between software simulation and hardware co-simulation, which greatly facilitates switching between different simulation engines and design debugging. The circuits and methods of the present invention also support a more flexible and data oriented mapping between the test bench samples and the DUT interface. In particular, test bench samples may be of any arbitrary dimension, and may be converted into a sequence or multiple parallel sequences of scalar samples and vice versa. A gateway interface may be associated with a single port or multiple ports of the DUT. A single scalar sample may be "up sampled" into multiple scalar samples, or multiple scalar samples may be "down sampled" into a single scalar sample. Accordingly, the adaptive gateway interface includes more built-in hardware abstraction and automation for data marshalling and synchronization, such as buffering, time division multiplexing/de-multiplexing, and up/down sampling. Because the adaptive gateway input and output circuits may be implemented in programmable logic of a device having programmable logic, such as a device described in more detail in reference to FIGS. 4 and 5 below, a design under test may easily be tested with different test benches having different configurations of test sources which may be applied differently to the design under test.

Figure 4:
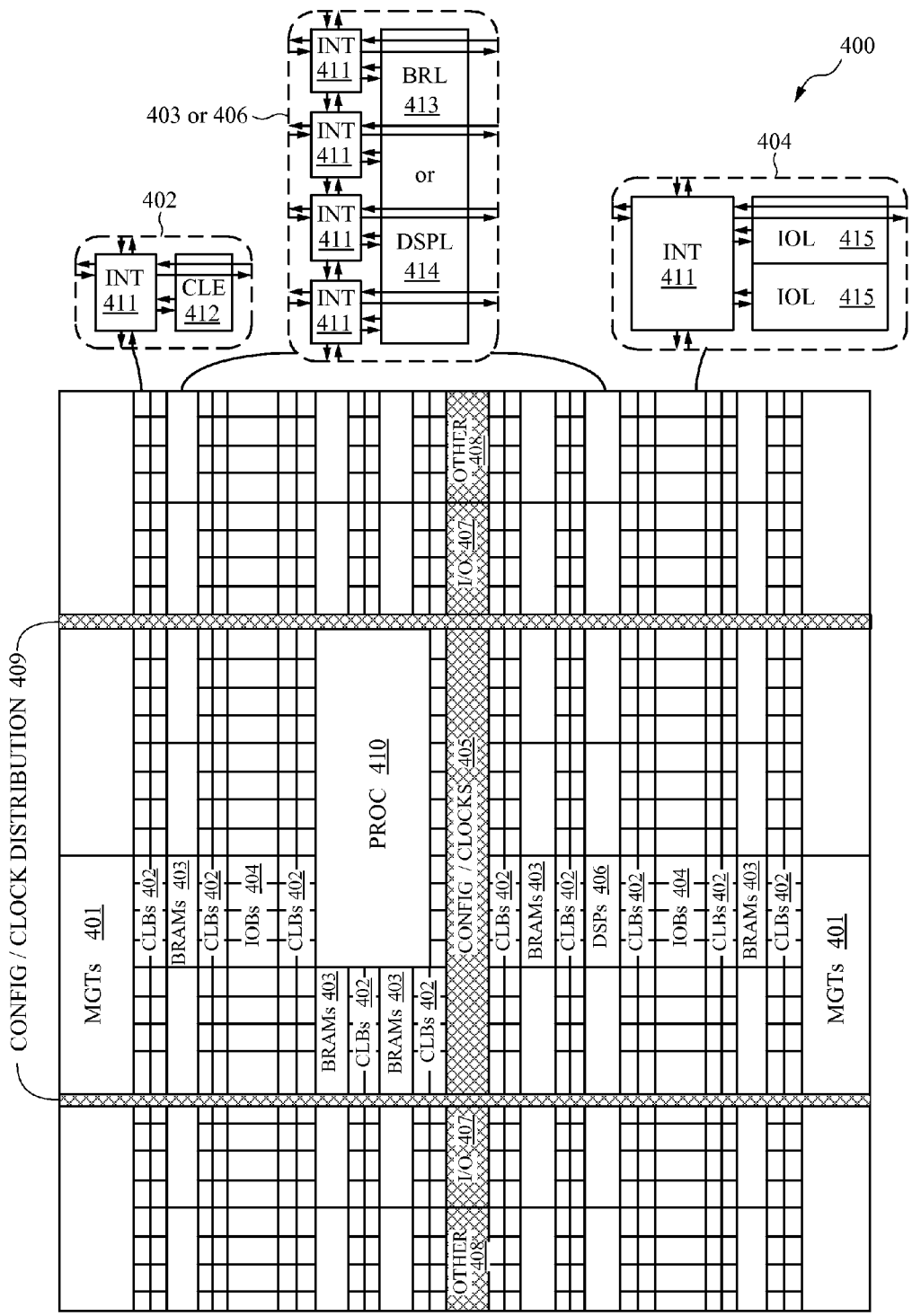
FIG. 4 is a block diagram of a device having programmable logic according to an embodiment of the present invention.

Turning now to FIG. 4, a block diagram of a device having configurable logic according to an embodiment the present invention is shown. The device of may be used to implement the design under test as well as the adaptive gateway input and output blocks. While devices having programmable logic may be implemented in any type of integrated circuit device, such as an application specific integrated circuit (ASIC) having programmable logic, other devices comprise dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 4 comprises an FPGA architecture 400 having a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 may include a configurable logic element (CLE 412) that may be programmed to implement user logic plus a single programmable interconnect element (INT 411). A BRAM 403 may include a BRAM logic element (BRL 413) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 406 may include a DSP logic element (DSPL 414) in addition to an appropriate number of programmable interconnect elements. An 10B 404 may include, for example, two instances of an input/output logic element (IOL 415) in addition to one instance of the programmable interconnect element (INT 411). The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA. Some FPGAs utilizing the architecture illustrated in FIG. 4 include additional logic blocks that disrupt the regular columnar structure making up a large part of the FPGA. The additional logic blocks may be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic. The circuits and methods of the present invention may be implemented in the PLD of FIG. 4, or in any other suitable device, including any type of integrated circuit having programmable logic.

Figure 5:
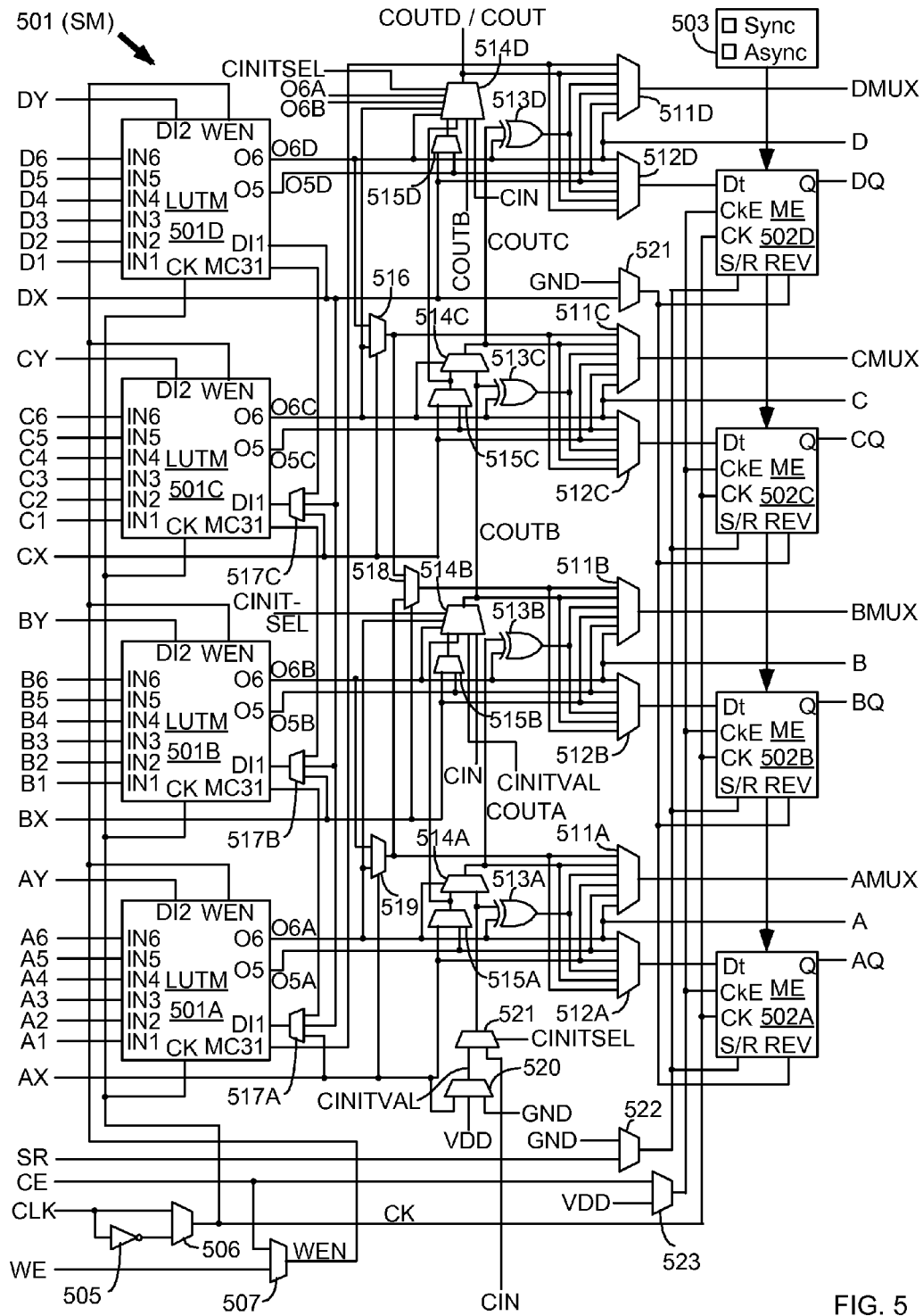
FIG. 5 is a block diagram of a configurable logic element of the device of FIG. 4 according to an embodiment of the present invention.

Turning now to FIG. 5, a block diagram of a configurable logic element of the device of FIG. 4 according to an embodiment of the present invention is shown. In particular, FIG. 5 illustrates in simplified form a configurable logic element of a configuration logic block 402 of FIG. 4. In the embodiment of FIG. 5, slice M 501 includes four lookup tables (LUTMs) 501A-501D, each driven by six LUT data input terminals A1-A6, B1-B6, C1-C6, and D1-D6 and each providing two LUT output signals O5 and O6. The O6 output terminals from LUTs 501A-501D drive slice output terminals A-D, respectively. The LUT data input signals are supplied by the FPGA interconnect structure via input multiplexers, which may be implemented by programmable interconnect element 511, and the LUT output signals are also supplied to the interconnect structure. Slice M also includes: output select multiplexers 511A-511D driving output terminals AMUX-DMUX; multiplexers 512A-512D driving the data input terminals of memory elements 502A-502D; combinational multiplexers 516, 518, and 519; bounce multiplexer circuits 522-523; a circuit represented by inverter 505 and multiplexer 506 (which together provide an optional inversion on the input clock path); and carry logic comprising multiplexers 514A-514D, 515A-515D, 520-521 and exclusive OR gates 513A-513D. All of these elements are coupled together as shown in FIG. 5, wherein an output CINITVAL of the multiplexer 520 is coupled to an input of multiplexer 521, which receives a CINITSEL signal at a control input. A CIN signal is also coupled to an input of the multiplexer 514B. Where select inputs are not shown for the multiplexers illustrated in FIG. 5, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 5 for clarity, as well as from other selected figures herein.

In the pictured embodiment, each memory element 502A-502D may be programmed to function as a synchronous or asynchronous flip-flop or latch. The selection between synchronous and asynchronous functionality is made for all four memory elements in a slice by programming Sync/Asynch selection circuit 503. When a memory element is programmed so that the S/R (set/reset) input signal provides a set function, the REV input terminal provides the reset function. When the memory element is programmed so that the S/R input signal provides a reset function, the REV input terminal provides the set function. Memory elements 502A-502D are clocked by a clock signal CK, which may be provided by a global clock network or by the interconnect structure, for example. Such programmable memory elements are well known in the art of FPGA design. Each memory element 502A-502D provides a registered output signal AQ-DQ to the interconnect structure. Because each LUT 501A-501D provides two output signals, O5 and O6, the LUT may be configured to function as two 5-input LUTs with five shared input signals (IN1-IN5), or as one 6-input LUT having input signals IN1-IN6.

In the embodiment of FIG. 5, each LUTM 501A-501D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data AX-DX is supplied to the 64-bit RAM via input terminal DI1 (via multiplexers 517A-517C for LUTs 501A-501C), or to the two 32-bit RAMs via input terminals DI1 and DI2. RAM write operations in the LUT RAMs are controlled by clock signal CK from multiplexer 506 and by write enable signal WEN from multiplexer 507, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 501A may also be provided to the general interconnect structure for shift register chaining, via output select multiplexer 511D and CLE output terminal DMUX. The devices having programmable logic and methods of the present invention may be implemented according to the device of FIGS. 4 and 5, or in any device, including any type of integrated circuit having programmable logic.

Figure 6:
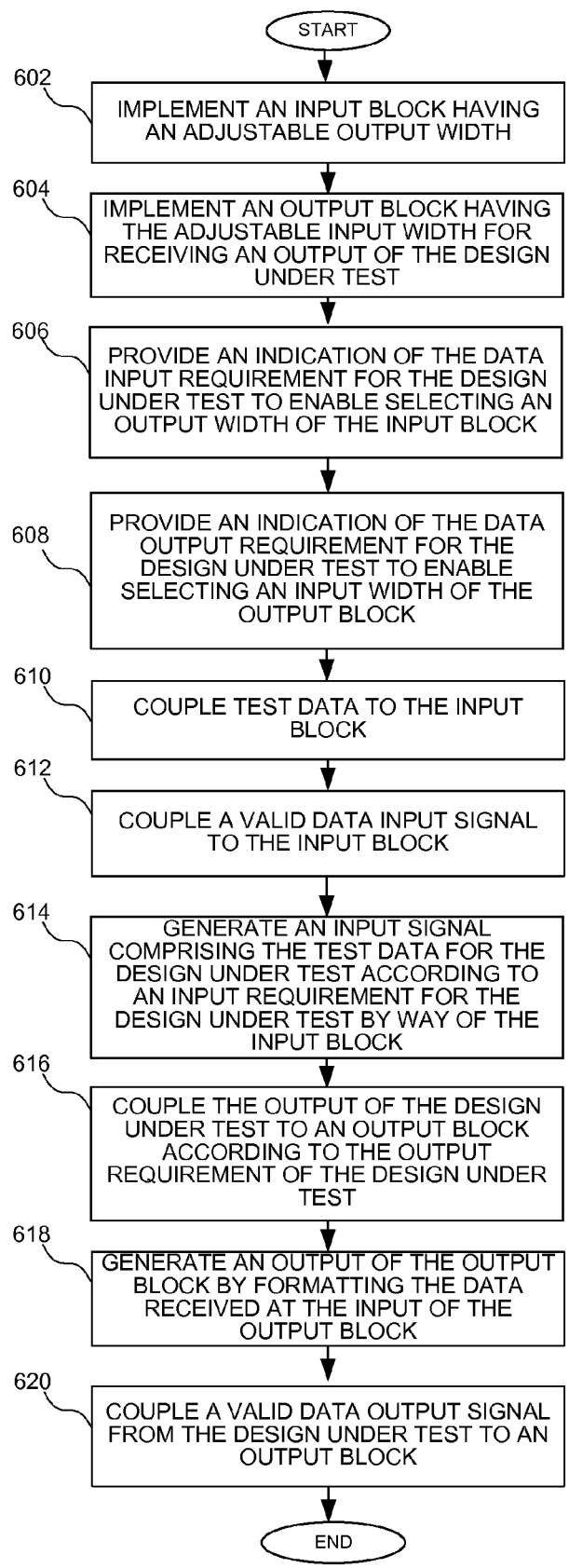
FIG. 6 is a flow chart showing a method of performing a simulation of a design under test according to an embodiment of the present invention.

Turning now to FIG. 6, a flow chart showing a method of performing a simulation of a design under test according to an embodiment of the present invention. An input block having an adjustable output width is implemented at a step 602. An output block having the adjustable input width for receiving an output of the design under test is implemented at a step 604. An indication of the data input requirement for the design under test is provided to enable selecting an output width of the input block at a step 606, while an indication of the data output requirement for the design under test is provided to the output block to enable selecting an input width of the output block at a step 608. Test data is coupled to the input block at a step 610, and a valid data input signal is coupled to the input block at a step 612. An input signal comprising the test data for the design under test is generated according to an input requirement for the design under test by way of the input block at a step 614. The output of the design under test is coupled to an output block according to the output requirement of the design under test at a step 616. An output of the output block is generated by formatting the data received at the input of the output block at a step 618. A valid data output signal from the design under test is coupled to an output block at a step 620.

Figure 7:
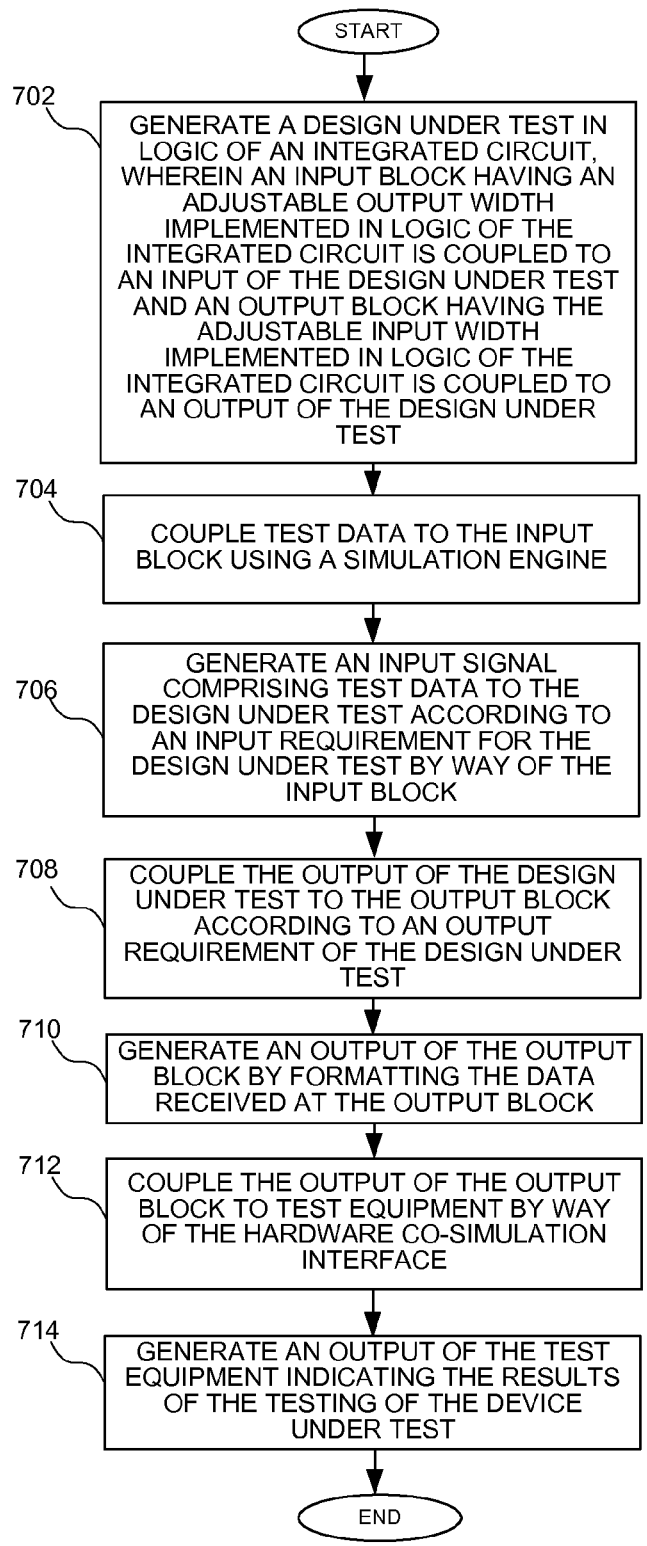
FIG. 7 is a flow chart showing a method of performing a simulation of a design under test according to an alternate embodiment the present invention.

Turning now to FIG. 7, a flow chart showing a method of performing a simulation of a design under test according to an alternate embodiment the present invention. A design under test is generated in logic of an integrated circuit, wherein an input block having an adjustable output width implemented in logic of the integrated circuit is coupled to an input of the design under test, and an output block having an adjustable input width implemented in logic of the integrated circuit is coupled to an output of the design under test at a step 702. Test data is coupled to the input block using a simulation engine at a step 704. An input signal comprising test data for the design under test is generated according to an input requirement for the design under test by way of the input block at a step 706. The output of the design under test is coupled to the output block according to an output requirement of the design under test at a step 708. An output of the output block is generated by formatting the data received at the output block at a step 710. The output of the output block is coupled to test equipment by way of the hardware co-simulation interface at a step 712, and an output of the test equipment indicating the results of the testing of the device under test is generated at a step 714. The steps of the method of FIGS. 6 and 7 may be implemented according to any of the circuits as described above, or using some other suitable circuit.

It can therefore be appreciated that the new and novel method of performing a simulation of a design under test and a circuit for enabling testing of a circuit design implemented in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of performing a simulation of a design under test, the method comprising:
    implementing an input block having an adjustable output width, wherein an output of the input block has a first width corresponding to an input requirement for the design under test;
    coupling test data of an input frame of bits having an arbitrary dimension to the input block;
    transforming the test data of the input frame of bits to conform to the input requirement for the design under test;
    buffering the test data of the input frame of bits in the input block, wherein the buffered test data comprises a multi-dimensional sample that includes scalar values;
    generating, by way of the input block, an input signal comprising the buffered test data for the design under test by scanning the buffered test data in a pre-defined order, wherein the input signal comprises individual scalar values that are extracted from the scalar values of the buffered test data and provided to an input of the design under test having the first width corresponding to the input requirement for the design under test;
    implementing an output block having an adjustable input width for receiving data from an output of the design under test; and
    coupling the output of the design under test to the output block according to an output requirement of the design under test.

2. The method of claim 1 wherein coupling test data to the input block comprises coupling data source blocks in a first format, and wherein generating the input signal for the design under test comprises formatting the test data of the data source blocks according to the input requirement for the design under test.

3. The method of claim 1 further comprising generating an output of the output block by formatting the data received at the output block from the design under test.

4. The method of claim 1 further comprising providing an indication of the input requirement for the design under test to enable selecting an output width of the input block.

5. The method of claim 1 further comprising providing an indication of the output requirement for the design under test to enable selecting an input width of the output block.

6. The method of claim 1 further comprising coupling a valid data input signal to a valid data input block.

7. The method of claim 6 further comprising coupling a valid data output signal from the design under test to a valid data output block.

8. A method of performing a simulation of a design under test, the method comprising:
    generating the design under test in an integrated circuit, wherein an input block having an adjustable output width implemented in the integrated circuit is coupled to an input of the design under test and an output block having the adjustable input width implemented in the integrated circuit is coupled to an output of the design under test, wherein the input block is configured with an output having a first width corresponding to an input requirement for the design under test;
    receiving test data of an input frame of bits having an arbitrary dimension;
    coupling the test data to the input block using a simulation engine;
    transforming the test data of the input frame of bits to conform to the input requirement for the design under test;
    buffering the test data of the input frame of bits in the input block, wherein the buffered test data comprises a multi-dimensional sample that includes scalar values;
    generating, by way of the input block, an input signal comprising the buffered test data for the design under test by scanning the buffered test data in a pre-defined order, wherein the input signal comprises individual scalar values that are extracted from the scalar values of the buffered test data and provided to the input of the design under test having the first width corresponding to the input requirement for the design under test; and
    coupling the output of the design under test to the output block according to an output requirement of the design under test.

9. The method of claim 8 wherein coupling the test data to the input block comprises coupling data source blocks in a first format, and wherein generating the input signal for the design under test comprises formatting data of data source blocks according to the input requirement for the design under test.

10. The method of claim 8 wherein coupling the test data to the input block comprises coupling the test data by way of a hardware co-simulation interface.

11. The method of claim 10 further comprising generating an output of the output block by formatting data received at the output block.

12. The method of claim 11 further comprising coupling the output of the output block to test equipment by way of the hardware co-simulation interface.

13. The method of claim 12 further comprising generating an output of the test equipment indicating the results of testing of the device under test.

14. The method of claim 8 wherein coupling the input block to the input of the design under test and coupling the output block to the output of the design under test comprises implementing adjustable gateways in programmable logic of a device having programmable logic.

15. A circuit for enabling testing of a circuit design implemented in an integrated circuit, the circuit comprising:
    a design under test implemented in the integrated circuit, the design under test having an input port comprising a first data width and an output port comprising a second data width;
    an input block coupled to the design under test, the input block having an input for receiving test data of an input frame of bits of an arbitrary dimension and having an adjustable output width, wherein the input block is configured to have an output of the first data width corresponding to an input requirement of the design under test for coupling the test data having the first data width to the input port of the design under test, the input block buffering the test data and transforming the test data of the input frame of bits to conform to the input requirement of the design under test, wherein the buffered test data includes a multi-dimensional sample that contains scalar values, and wherein the test data having the first data width coupled to the input port of the design under test comprises individual scalar values that are extracted from the scalar values of the buffered test data by a scanning of the buffered test data in a predefined order; and
    an output block coupled to the design under test, the output block having an adjustable input width for receiving output data from the output port of the design under test at an input port comprising the second data width.

16. The circuit of claim 15 wherein the output block comprises an input having a configuration corresponding to an output requirement of the design under test.

17. The circuit of claim 15 further comprising a data valid input block coupled to a data valid input of the design under test and a data valid output block coupled to a data valid output of the design under test.

18. The circuit of claim 15 wherein the integrated circuit comprises an input for receiving the test data in a first format and an output for generating the output data in a second format.

19. The circuit of claim 15 wherein the design under test comprises a circuit implemented in programmable logic of a device having programmable logic.

* * * * *